United States Patent
Galuschka

(10) Patent No.: US 6,882,697 B1
(45) Date of Patent: Apr. 19, 2005

(54) DIGITAL COUNTER

(75) Inventor: Holger Galuschka, Berlin (DE)

(73) Assignee: Tektronix International Sales GmbH, Schaffhausen (CH)

( * ) Notice: Subject to any disclaimer, the term of this patent is extended or adjusted under 35 U.S.C. 154(b) by 0 days.

(21) Appl. No.: 10/835,139

(22) Filed: Apr. 28, 2004

(30) Foreign Application Priority Data

May 14, 2003 (EP) .............................................. 03010817

(51) Int. Cl.$^7$ ............................................ H03K 21/40
(52) U.S. Cl. ............................ 377/3; 377/19; 377/20; 377/24; 377/26; 377/28; 377/30; 377/33; 377/51
(58) Field of Search ................................ 377/3, 19, 20, 377/24, 26, 28, 30, 33, 51

(56) References Cited

U.S. PATENT DOCUMENTS

| | | |
|---|---|---|
| 4,086,470 A | 4/1978 | Ashbee |
| 4,151,403 A | 4/1979 | Woolston |
| 4,566,069 A | 1/1986 | Hirayama et al. |
| 5,572,720 A | 11/1996 | Reed et al. |
| 5,826,066 A | 10/1998 | Jardine et al. |
| 6,625,571 B1 | 9/2003 | Michi et al. |

*Primary Examiner*—Margaret R. Wambach
(74) *Attorney, Agent, or Firm*—Francis I. Gray

(57) ABSTRACT

A digital counter with a dial position having a hardware part which determines the n lowest-value bits of the dial position and a software part which determines the remaining higher-value bits of the dial position includes first and a second software parts as the software part with the dial position being a combination of the first software part and the hardware part when the hardware part is in a first counting range, and being a combination of the second software part and the hardware part when the hardware part is in a second counting range.

16 Claims, 2 Drawing Sheets

| | HW | | | |
|---|---|---|---|---|
| | BIN | DEC. | HEX. | START:<br>SW0=0000<br>SW1=0000 |
| SW0 { | 0 0 0 0 | 0 | 0 | |
| | 0 0 0 1 | 1 | 1 | |
| | 0 0 1 0 | 2 | 2 | |
| | 0 0 1 1 | 3 | 3 | SW1=SW0 |
| | 0 1 0 0 | 4 | 4 | |
| | 0 1 0 1 | 5 | 5 | |
| | 0 1 1 0 | 6 | 6 | |
| | 0 1 1 0 | 7 | 7 | |
| SW1 { | 1 0 0 0 | 8 | 8 | |
| | 1 0 0 1 | 9 | 9 | |
| | 1 0 1 0 | 10 | A | |
| | 1 0 1 1 | 11 | B | SW0=SW0+1 |
| | 1 1 0 0 | 12 | C | |
| | 1 1 0 1 | 13 | D | |
| | 1 1 1 0 | 14 | E | |
| | 1 1 1 1 | 15 | F | |

$$SW0' = 2^4 \cdot SW0 \quad (1)$$
$$SW1' = 2^4 \cdot SW1 \quad (2)$$

```
                    HW                  START:
                                        SW0=0000
         BIN       DEC.      HEX.       SW1=0000
      ┌  0 0 0 0    0         0
      │  0 0 0 1    1         1
      │  0 0 1 0    2         2
      │  0 0 1 1    3         3
SW0  ─┤                                ── SW1=SW0
      │  0 1 0 0    4         4
      │  0 1 0 1    5         5
      │  0 1 1 0    6         6
      └  0 1 1 0    7         7
      ┌  1 0 0 0    8         8
      │  1 0 0 1    9         9
      │  1 0 1 0   10         A
      │  1 0 1 1   11         B
SW1  ─┤                                ── SW0=SW0+1
      │  1 1 0 0   12         C
      │  1 1 0 1   13         D
      │  1 1 1 0   14         E
      └  1 1 1 1   15         F
```

$$Z = 2^4 \cdot SW_M + HW \qquad (3)$$

$$Z' = \frac{10}{16} \cdot Z \qquad (4)$$

$$Z' = \frac{10}{16} \cdot [16 \cdot SW_M + HW] \qquad (5)$$

$$Z' = 10 \cdot SW_M + \frac{10}{16} \cdot HW \qquad (6)$$

FIG.4

DIGITAL COUNTER

BACKGROUND OF THE INVENTION

The present invention relates to digital counters, and more particularly to a digital counter having a dial position that includes a hardware part to determine the n lowest-value bits of the dial position and a software part to determine the remaining higher-value bits of the dial position.

Counters having both hardware and software parts are known, the hardware part often being realized through the use of flip-flops. Counters of this kind are used, for example, for assigning time stamps in devices for monitoring telecommunication links. As a time stamp, the relevant dial position is used. In order to minimize the effort, the hardware part is usually realized as a 16 to 32 bit counter. If there is an overflow, the software part is counted up by 1. For this, it must be taken into account that an overflow of the hardware part initiates an interrupt and that an interrupt server cannot, however, operate at any speed. In the area of the hardware part overflow, there is therefore a certain dead time. For example, there is conceivably a situation in which the hardware part is already back to 0000 . . . , but the software part has not yet counted up. If this data were to be selected for a time stamp, the clock would practically count backwards. Consequently, the result would be incorrect.

In order to prevent this the hardware part of the counter is read twice to be on the safe side, so that the assignment of lower-value and higher-value bits can proceed correctly. Accordingly, if the second value is smaller than the value read first, there has been an overflow. Accordingly, the dial position resulting from the software part and the second read hardware and software part is the correct one.

However, this solution cannot be used in those cases where a processor can only process one interrupt at a time. There may be situations in which the processor receives an interrupt from the overflow of the hardware part and at the same time an interrupt from the event that is to be provided with a time stamp. The processor will be blocked until the first interrupt has been processed and will then assign an incorrect time stamp to the event.

What is desired is to eliminate this problem which results with a generic counter, and to provide a corresponding method for operating a digital counter which eliminates this problem.

BRIEF SUMMARY OF THE INVENTION

Accordingly the present invention provides a digital counter where the time-critical coinciding of two interrupts is prevented by executing the software part twice, the corresponding software part being converted at a non-time-critical point in time so that when the overflow of the hardware part of the counter occurs, the already converted software part applicable at this point in time is read. Since the conversion of the software part applicable in a given case no longer coincides with the overflow of the hardware part of the counter, the problem of the prior art are reliably avoided.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 3 is a schematic representation a validity range of the relevant software part on a simple embodiment and the preferred point in time for changing the relevant software part according to the present invention.

FIG. 4 explains the re-normalizing of a digital counter according to the pre sent invention.

DETAILED DESCRIPTION OF THE INVENTION

Figure 1:
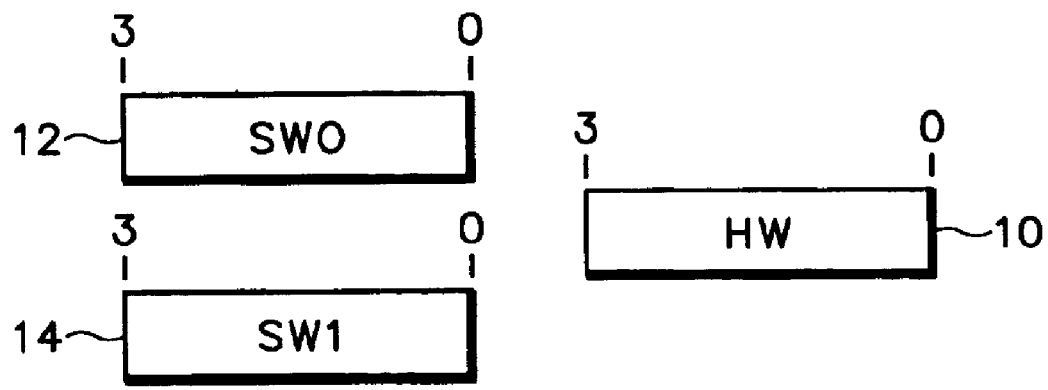
FIG. 1 is a schematic representation a hardware part and two software parts of a first embodiment of a digital counter according to the present invention.

A preferred realization has a maximum dial position of a hardware part correlated with a maximum value, a first counting range of the hardware part essentially defined between dial positions of 0 and half of the maximum value of the hardware part minus 1, and a second counting range essentially defined between the dial positions of half of the maximum value and the maximum value of the hardware part minus 1. For the hardware part with 4 bits the first range stretches from 0 to 7 and the second range from 8 to 15. The maximum value is thus 16. For a decimal system, the first range is from 0 to 4, the second range from 5 to 9, and the maximum value is 10. The maximum value therefore denotes the number of different values that are possible within the relevant system: in the decimal system 10, for example, and with 4 bits 16, for example. The result may also be achieved if slightly different definitions are chosen, as is evident to a person skilled in the art. What is essential is that the time periods during which a relevant software part is read do not overlap with the point in time at which the relevant software part is changed.

Therefore, a digital counter preferably has a software part-increasing device which is designed to change first and second software parts at predeterminable values of the hardware part, particularly to effect an increase by the value of 1. Where a software part is increased by 1, the other, instead of being increased by 1, may, at the point in time at which its next change occurs, be equated with the software part changed first.

Non-critical points in time for increasing the second software part lie at the hardware part, which is between 10 and 40 percent of the maximum value, preferably 25 percent of the maximum value. Accordingly, for the first software part, the hardware part between 60 and 90 percent of the maximum value, preferably 75 percent of the maximum value, applies.

A normalization of the dial position to a maximum value other than that predetermined by the installed hardware part of the counter is often desired. In particular by re-normalizing to another maximum value, an easier interpretation of the assigned time stamps may often be achieved.

For example, the hardware part works with a maximum value of 24,576,000. What is desired, however, is a normalization to a maximum value of 2,000,000. This is achieved by having the dial position, which is normalized to the second maximum value, made up of a software part normalized to the second maximum value and hardware part normalized to the second maximum value.

The software part is then designed such that it also has the n lowest-value bits, which, to be precise, is done by shifting the original software part to the left. Shifting to the left corresponds to multiplication by the first maximum value. Since re-normalizing also requires division by the first maximum value, both processes cancel each other out. What remains from the re-normalization is a factor that corresponds to the second maximum value. These values for the software parts, which are normalized to the second maximum value, are preferably saved so that they may be used for adding within the relevant period of time without having to be recalculated.

The hardware part normalized to the second maximum value is preferably calculated by the following step: multiplying by the second maximum value and dividing by the first maximum value, or vice versa.

Putting together the relevant software part and the relevant hardware part may be achieved in an easy way after the aforementioned multiplication step of the software part valid at the time by the second maximum value, by adding the software part normalized to the second maximum value and the hardware part normalized to the second maximum value.

Preferably, the aforementioned multiplication step, in which the software part valid at the time is multiplied by the second maximum value, is performed at a non-computation time-critical point in time. Preferably, a calculation of the second software part normalized to the second maximum value is performed at a value between 10 and 40 percent of the first maximum value of the hardware part, particularly at 25 percent of the first maximum value of the hardware part, and the calculation of the first software part normalized to the second maximum value is performed at a value between 60 and 90 percent of the first maximum value of the hardware part, particularly at 75 percent of the first maximum value of the hardware part.

FIG. 1 shows in a schematic representation the actual dial position on a first embodiment of the digital counter. According thereto, the four lowest-value bits are determined by the hardware part 10, while the four remaining bits are either determined by a first software part 12 or by a second software part 14.

FIG. 3 shows on a simple embodiment—the hardware part and the software parts each have 4 bits—the validity range of the relevant software part 12, 14 and the preferred points in time for changing the relevant software part. Both the software part 12, SW0, and the software part 14, SW1, start at the value of 0, i.e. all four bits are zeros. According to the figure, the software part 12, SW0, is linked with the hardware part 10 for the values 0 to 7 (in decimal notation) of the hardware part. The software part 14, SW1, is linked with the hardware part for the values 8 to 15 of the hardware part 10. The software part 14, SW1, is preferably changed between the values 3 and 4 of the hardware part 10, i.e., either counted up by 1 or equated with the software part 12, SW0. The software part 12, SW0, is increased by 1 between the decimal values 11 and 12 of the hardware part 10. As is seen from the representation of FIG. 3, the software part 14, SW1, is thus changed at a point in time at which the hardware part 10 is linked with the software part 12, SW0, for the full display of the digital counter, while the software part 12, SW0, is increased by 1 when the hardware part 10 is linked with the software part 14, SW1. Hence the points in time for the changing of the software parts are separate from the point in time of the overflow of the hardware part 10.

Figure 2:
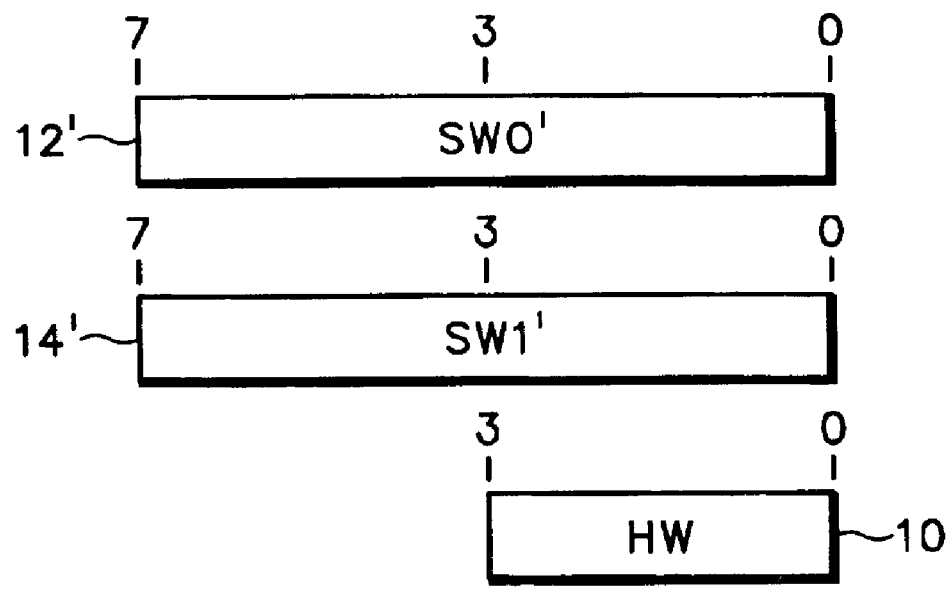
FIG. 2 is a schematic representation two software parts and a hardware part of a second embodiment of a digital counter according to the present invention.

While with the embodiment according to FIG. 1 the software part and the hardware part are connected with each other in series, so that the hardware part 10 determines the lowest-value bits and software part valid at the time determines the remaining higher-value bits, there is shown in FIG. 2 an embodiment in which the dial position is obtained by adding the hardware part to the software part SW0', SW1' valid at the time. This way the software part 12', SW0' is created by a shifting to the left of the software part 12 by as many bits as the hardware part 10 has, in the present case by 4 digits. This corresponds to a multiplication by $2^{4=16}$. The same applies, mutatis mutandis, to the software part 14', SW1', which is obtained by a corresponding shift to the left from the software part 14, SW1. For details, see equations (1) and (2) in FIG. 2.

The current dial position then results from adding the hardware part 10 to the software part 12', SW0', or 14', SW1' valid at the time.

FIG. 4 shows the re-normalization. It is assumed that, as is shown in FIGS. 1, 2 and 3, the hardware part can assume sixteen values, and that this count is now to be re-normalized into the decimal system. For m=0 or 1 the dial position Z according to equation (3) in FIG. 4 is received as $2^4 \cdot SWm + HW$. The dial position Z' normalized to the decimal system is obtained therefrom by multiplying by 10 and dividing by 16, see equation (4) in FIG. 4. If equation (3) is inserted into equation (4), then equation (5) results, which, after canceling of the number 16 in the first term, is reformulated into equation (6).

In equation (6) the first term, which only changes twice in the value range of the hardware part 10, is calculated at non-time critical points in time. The second term in equation (6) is only 4 bits wide, so that the multiplication and division to be performed thereon is carried out with a relatively low time and computation expense. In contrast, if the expression in the square brackets of equation (5) were to be resolved, by followed by multiplication and division, a value with twice the number of bits would have to be multiplied and divided.

Thus the present invention provides a digital counter with a hardware part and a software part where the software part is separated into two parts such that each software part increments during a non-critical time at different time during the count range of the hardware part so that at any particular point in time the combination of the hardware part with one of the software parts gives the proper count.

What is claimed is:

1. A digital counter of the type having a dial position which includes a hardware part determining the n lowest-value bits of the dial position and a software part determining the remaining higher-value bits of the dial position, wherein the software part comprises:

first and second software parts with the dial position being a combination of the first software part and the hardware part when the hardware part is in a first counting range, and being a combination of the second software part and the hardware part when the hardware part is in a second counting range.

2. The digital counter according to claim 1 wherein the first counting range comprises a range between a minimum value of the hardware part and half of a maximum value of the hardware part minus 1, and the second counting range comprises a range between half of the maximum value and the maximum value of the hardware part minus 1.

3. The digital counter according to claims 1 or 2 wherein at predetermined values of the hardware part the first and the second software parts respectively increment.

4. The digital counter according to claim 3 wherein the predetermined value of the hardware part for incrementing the second software part is between 10 and 40 percent of the maximum value.

5. The digital counter according to claim 3 wherein the predetermined value of the hardware part for incrementing the first software part is between 60 and 90 percent of the maximum value.

6. The digital counter according to claim 4 wherein the predetermined value of the hardware part for incrementing the first software part is between 60 and 90 percent of the maximum value.

7. A method of operating a digital counter having a dial position including a hardware part, which determines the n lowest-value bits of the dial position, and a software part, which determines the remaining higher-value bits of the dial position, comprising the steps of:

dividing the software part into first and second software parts; and determining the dial position as a combination of the first software part and the hardware part when the hardware part is in a first counting range and as a combination of the second software part and the hardware part when the hardware part is in a second counting range.

8. The method according to claim 7 further comprising the step of incrementing the first and second software parts at respective predetermined values of the hardware part.

9. The method according to claim 8 wherein the predetermined value for incrementing the second software part comprises a value between 10 and 40 percent of a maximum value of the hardware part.

10. The method according to claim 8 wherein the predetermined value for incrementing the first software part comprises a value between 60 and 90 percent of a maximum value of the hardware part.

11. The method according to claim 9 wherein the predetermined value for incrementing the first software part comprises a value between 60 and 90 percent of a maximum value of the hardware part.

12. The method according to any one of claims 7–11 further comprising the steps of:

normalizing the hardware part having a first maximum value to a specified maximum value; and normalizing each the first and second software parts to the specified maximum value to produce normalized first and second software parts, the dial position in the determining step being a function of the normalized hardware part and the normalized first and second software part.

13. The method according to claim 12 wherein the first and second software part normalizing step comprises the step of multiplying the each of the first and second software parts with the specified maximum value.

14. The method according to claim 13 further comprising the step of saving the normalized first and second software parts so that they are available for use during the determining step within a relevant period of time.

15. The method according to claim 12 wherein the hardware part normalizing step comprises the steps of multiplying the hardware part by the specified maximum value and dividing by the first maximum value.

16. The method according to claim 15 the first and second software part multiplying step comprises the steps of:

multiplying at a non-computation-time-critical point in time the second software part by the specified maximum value when the hardware part has the related predetermined value; and multiplying at a non-computation-time-critical point in time the first software part by the specified maximum value when the hardware part has the related predetermined value.

* * * * *